(12) United States Patent
Park

(10) Patent No.: US 9,165,686 B2
(45) Date of Patent: Oct. 20, 2015

(54) TEST MEDIATION DEVICE, SYSTEM FOR TESTING MEMORY DEVICE AND METHOD FOR TESTING MEMORY DEVICE

(71) Applicant: SK hynix Inc., Gyeonggi-do (KR)

(72) Inventor: Mun-Phil Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 243 days.

(21) Appl. No.: 13/844,942

(22) Filed: Mar. 16, 2013

(65) Prior Publication Data

US 2014/0185399 A1    Jul. 3, 2014

(30) Foreign Application Priority Data

Dec. 28, 2012    (KR) .......................... 10-2012-0157442

(51) Int. Cl.
| | | |
|---|---|---|
| *G11C 29/00* | (2006.01) | |
| *G11C 29/04* | (2006.01) | |
| *G11C 29/56* | (2006.01) | |
| *G11C 29/44* | (2006.01) | |

(52) U.S. Cl.
CPC ........ *G11C 29/56008* (2013.01); *G11C 29/785* (2013.01); *G11C 2029/4402* (2013.01); *G11C 2029/5602* (2013.01)

(58) Field of Classification Search
None
See application file for complete search history.

(56) References Cited

U.S. PATENT DOCUMENTS

| 5,631,868 | A  | * | 5/1997  | Termullo et al. .............. 365/200 |
|---|---|---|---|---|
| 5,987,632 | A  | * | 11/1999 | Irrinki et al. .................. 714/711 |
| 7,526,700 | B2 | * | 4/2009  | Motomochi .................. 714/733 |
| 2004/0062135 | A1 | * | 4/2004  | Itakura .......................... 365/232 |
| 2005/0107976 | A1 | * | 5/2005  | Klijn et al. .................... 702/118 |

FOREIGN PATENT DOCUMENTS

| KR | 1020110132073 | 12/2011 |
|---|---|---|
| KR | 1020120095702 | 8/2012 |

* cited by examiner

*Primary Examiner* — Justin R Knapp
(74) *Attorney, Agent, or Firm* — IP & T Group LLP

(57) ABSTRACT

A system for testing a memory device includes a memory device configured to include a plurality of memory cells, receive a test information having a first frequency, access memory cells corresponding to an address included in the test information, and activate a fail signal if fail occurs in the memory cells corresponding to the address, a test device configured to generate a test information having a second frequency different from the first frequency, and a test mediation device configured to generate the test information having the first frequency and the address based on the test information having the second frequency and the fall signal and store the address corresponding to the fail memory cells in response to the fail signal as a fail address.

22 Claims, 3 Drawing Sheets

TEST MEDIATION DEVICE, SYSTEM FOR TESTING MEMORY DEVICE AND METHOD FOR TESTING MEMORY DEVICE

CROSS-REFERENCE TO RELATED APPLICATIONS

The present application claims priority of Korean Patent Application No. 10-2012-0157442, filed on Dec. 28, 2012 which is incorporated herein by reference in their entireties.

BACKGROUND

1. Field

Exemplary embodiments of the present invention relate to a test mediation device and a system and method for testing a memory device, which are capable of increasing the yield of memory devices and reducing the test time.

2. Description of the Related Art

If fail occurs in a memory cell when fabricating memory devices, a repair process of enabling a redundancy circuit, which is included in a memory device treated as being failed, to be used is performed in order to repair the failed memory device. In general, a redundancy circuit includes a metallic fuse for storing fail information on a memory device, for example, the address of a fail memory cell, word line, or bit line, and the fuse is cut using a laser and the fail information is stored in the fuse in a repair process.

In general, this repair process of cutting a fuse using a laser and storing fail information is performed when a memory device is in a wafer state or a die state. This is because it is difficult to perform a laser test for detecting a fail memory cell of a memory device if the memory device is in a package state or a module state. For this reason, a test device, for example, a probe test device, for testing a memory device in a wafer state differs from a test device for testing a memory device in a package state or a module state in terms of a storage unit for storing information necessary when a test is performed.

A test device for testing a memory device in a wafer state is designed to determine whether a target test memory device has failed or not and store information for a repair process in order to perform the repair process for repairing a fail memory device. The information for the repair process includes information on the address of a fail memory cell or signal line, for example, a word line or a bit line, in the fail memory device. In contrast, the test device for testing a memory device in a package state or a module state is commonly designed not to store information for a repair process because the repair process is not accompanied.

Accordingly, if a memory device that has passed a test in a wafer state does not pass a test in a package state or a module state, the memory device cannot be repaired. In this case, there is a concern in that a repairable memory device may be treated as being a fail memory. In order to solve this concern, a method of toughly setting test conditions in a wafer state in order to prevent fail from occurring in a package state or a module state may be used. If test conditions are toughly set in a wafer state, however, the yield of memory devices may be very low and thus even a usable memory device may be treated as being failed.

A redundancy circuit for repairing a fail memory device may include an electrical fuse, for example, e-fuse, that is electrically cut in order to overcome a limit resulting from a metallic fuse that is cut by a laser. The e-fuse is a resistive element having a specific resistance value. When a very high current flows through the e-fuse, a state of the e-fuse is changed, for example, the e-fuse is cut, and thus the e-fuse has a different resistance value from the e-fuse before the current flows. If a redundancy circuit includes an e-fuse, there is an advantage in that a fail memory device may be repaired in a package state and a module state as well as in a wafer state because the fail memory device may be repaired even without using laser cutting.

An e-fuse may be cut even when a memory device is in a package state or a module state. As described above, however, a test device for testing a memory device in a package state or a module state is designed not to store information for a repair process. Accordingly, a repair process on a fail memory device in a package state or a module state is still restricted.

In order overcome the limit of a test device designed not to store information for a repair process as described above, a method of adding a storage circuit for storing information for repair to the test device or a method of designing new test equipment including a storage circuit for storing information for repair may be used. It may be difficult to use both the methods because the methods may require enormous investment costs.

SUMMARY

Various embodiments of the present invention are directed to providing a test mediation device and a system and method for testing a memory device, which are capable of performing a repair process even in a package test in which information for repair is not stored in a test device in such a manner that the test mediation device disposed between the test device and the memory device stores information for repair in response to a fail signal received from the memory device.

Another embodiment of the present invention is directed to providing a test mediation device and a system and method for testing a memory device, which are capable of stably performing a repair process by allowing the test mediation device to supply high level voltage for cutting a fuse.

Yet another embodiment of the present invention is directed to providing a test mediation device and a system and method for testing a memory device, which are capable of increasing the yield of memory devices and reducing the test time and costs by using the above-described characteristics.

In accordance with an embodiment of the present invention, a system for testing a memory device may include a memory device configured to include a plurality of memory cells, receive a test information having a first frequency, access memory cells corresponding to an address included in the test information, and activate a fail signal if fail occurs in the memory cells corresponding to the address, a test device configured to generate a test information having a second frequency, and a test mediation device configured to generate the test information having the first frequency based on the test information having the second frequency and the fail signal and store the address corresponding to the fail memory cells in response to the fail signal as a fail address.

In accordance with another embodiment of the present invention, a test mediation device for coupling a memory device operating at a first frequency and a test device operating at a second frequency may include a frequency conversion unit configured to generate a test information having the first frequency based on a test information having the second frequency and a fail address storage unit configured to store an address included in the test information as a fail address in response to a fail signal indicating that fail occurs in the memory device.

In accordance with yet another embodiment of the present invention, a method of testing a memory device by using a memory device testing system, wherein the memory device testing system includes the memory device configured to operate at a first frequency and include a plurality of memory cells, a test device configured to operate at a second frequency, and a test mediation device configured to couple the memory device and the test device together may include by the test device, generating a test information having the second frequency; by the test mediation device, generating a test information having the first frequency based on the test information having the second frequency; by the memory device, receiving the test information having the first frequency and activating a fail signal if fail occurs in memory cells corresponding to an address included in the test information; and by the test mediation device, storing a fail address corresponding to the fail memory cells in response to the fail signal.

In accordance with still another embodiment of the present invention, A system for testing a memory device may include a memory device configured to include a plurality of memory cells, receive a test information, access memory cells corresponding to an address included in the test information, and activate a fail signal when fail occurs in the memory cells corresponding to the address and a test mediation device configured to externally receive the test information, input the received test information to the memory device, and store the address corresponding to the fail memory cell as a fall address in response to the fail signal.

DETAILED DESCRIPTION

Figure 1:
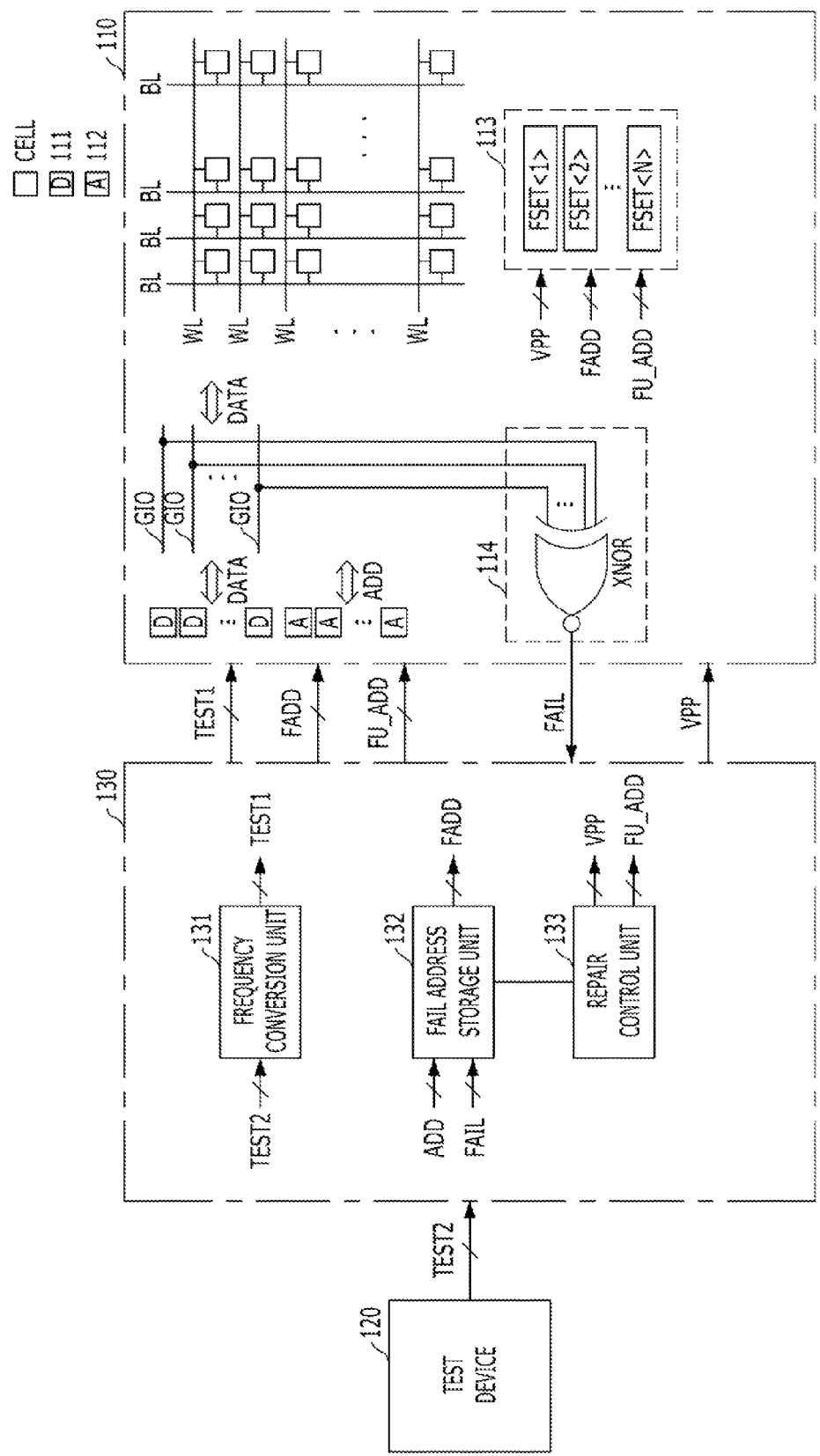
FIG. 1 is a diagram illustrating a system for testing a memory device in accordance with an exemplary embodiment of the present invention.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, a case where fail occurs in a memory cell CELL means a case where data may not be correctly stored in the memory cell CELL or data may not be correctly outputted from the memory cell CELL because fail occurs in the memory cell CELL itself or a case where data may not be correctly stored in the memory cell CELL coupled with a word line or a bit line or data may not be correctly outputted from the memory cell CELL coupled with the word line or the bit line because fail occurs in the word line or the bit line. Accordingly, a fail address FADD corresponding to a fail memory cell may be the address of the fall memory cell itself or may be the row address of a fail word line or the column address of a fail bit line.

FIG. 1 shows a system for testing a memory device in accordance with an exemplary embodiment of the present invention.

As shown in FIG. 1, the system for testing a memory device (hereinafter referred to as the test system) includes a plurality of memory cells CELL, a memory device 110, a test device 120, and a test mediation device 130. The memory device 110 receives test information TEST1 having a first frequency, access memory cells corresponding to an address ADD included in the test information TEST1, and activates a fail signal FAIL when fail occurs in memory cells corresponding to an address ADD<0:A>. The test device 120 generates the test information TEST2 having a second frequency different from the first frequency. The test mediation device 130 generates the test information TEST1 having the first frequency by using the test information TEST2 having the second frequency, inputs the test information TEST1 having the first frequency to the memory device 110, and stores a fail address FADD corresponding to fall memory cells when the fail signal FAIL is activated. Here, the second frequency may be lower than the first frequency.

For reference, the plurality of memory cells CELL of the memory device 110 is arranged in a matrix form and is coupled with a plurality of word lines WL and a plurality of bit lines BL. When a word line WL is activated, data DATA is prepared to be written into a plurality of memory cells CELL coupled with the activated word line WL and the data DATA is written into a memory cell CELL coupled with a selected bit line BL through the selected bit line BL. Among addresses, an address corresponding to a word line WL is a row address, and an address corresponding to a bit line BL is a column address. Hereinafter, the address ADD may be a row address or a column address.

The test system is described below with reference to FIG. 1.

The memory device 110 stores data in the plurality of memory cells CELL or outputs data stored in the plurality of memory cells CELL in response to the test information TEST1 generated from the test device 120. The test information TEST1 is information necessary for the memory device 110 to perform a test operation. The test information TEST1 includes one or more of a clock CLK, a command, and data. The clock CLK enables the memory device 110 to operate in response thereto. The command CMD enables the memory device 110 to perform an operation of storing data in the plurality of memory cells CELL or outputting data from the plurality of memory cells CELL in response thereto. The data DATA through which the plurality of memory cells CELL will be accessed in response to the command CMD and the address ADD.

More particularly, the memory device 110 includes a plurality of data pads 111 configured to input and output the data DATA, a plurality of address pads 112 configured to receive the address ADD, a plurality of global lines GIO configured to transfer the data DATA between the plurality of data pads 111 and the plurality of memory cells CELL, and a fuse array 113 configured to include a plurality of fuse sets FSET<1>–FSET<N> for storing the fail address FADD. The memory device 110 further includes a fail signal generator 114 configured to activate the fail signal FAIL when a fail occurs in the plurality of memory cells CELL. Here, the memory device 110 operates at the first frequency, and thus the frequencies of all signals included in the test information TEST1 applied to the memory device 110 are the first frequency.

The memory device 110 is synchronized with the clock CLK. When storing data DATA in response to the command CMD, the memory device 110 transfers the data DATA inputted to a plurality of the data pads 111, to memory cells CELL corresponding to an address ADD inputted to a plurality of the address pads 112 through a plurality of the global lines GIO. In contrast. When outputting data DATA in response to the command CMD, the memory device 110 transfers the data DATA stored in memory cells CELL corresponding to an address ADD, to a plurality of the data pads 111 through a plurality of global lines GIO. Here, the fail signal generator 114 activates the fail signal FAIL when fail occurs in memory cells CELL from which data DATA is outputted and deactivates the fail signal FAIL when fails does not occur in memory cells CELL from which data DATA is outputted.

The fuse array 113 includes the first to the $N^{th}$ fuse sets FSET<1>–FSET<N> for storing the fail address FADD. Each of the first to the Nu fuse sets FSET<1>–FSET<N> includes a plurality of fuses (not shown in FIG. 1) for storing the respective bits of the fail address FADD. Here, each of the plurality of fuses may be an e-fuse. When the fail address FADD is stored in the first to the $N^{th}$ fuse sets FSET<1>–FSET<N>, high level voltage VH higher than the power supply voltage VDD of the memory device 110 is supplied to the fuse array 113 and a state of a fuse is changed in response to the high level voltage VH. The fail address FADD may be sequentially used from the first fuse set FSET<1> to the $N^{th}$ fuse set FSET<N> or may be sequentially used from the $N^{th}$ fuse set FSET<N> to the first fuse set FSET<1>. In some embodiments, a fuse address FU_ADD having a value corresponding to one of the first to the $N^{th}$ fuse sets FSET<1>–FSET<N> may be received, and the fall address FADD may be stored in the fuse set corresponding to the fuse address FU_ADD.

For reference, the fall address FADD is the address (that is, a row address or a column address) of a fail memory cell, and the fuse address FU_ADD is an address for selecting a specific fuse set from the first to the $N^{th}$ fuse sets FSET<1>–FSET<N>.

When performing an operation of detecting the fail address FADD in the memory device 110, the test device 120 generates the test information TEST2 having a second frequency lower than a first frequency and outputs the test information TEST2 having the second frequency to the test mediation device 130. Furthermore, when performing an operation of storing the fail address FADD in the memory device 110, the test device 120 may generate the fuse address FU_ADD and output the fuse address FU_ADD to the test mediation device 130. Here, the test device 120 may be a test device for testing a memory device in a package state or a memory device in a module state.

The test mediation device 130 converts the second frequency of the test information TEST2, received from the test device 120, into a first frequency and inputs the test information TEST1 having the first frequency to the memory device 110. In addition to the test information TEST2, the test mediation device 130 converts the frequency of the fuse address FU_ADD, received from the test device 120, into a specific frequency and inputs the fuse address FU_ADD having the specific frequency to the memory device 110.

An operation of the test system may be divided into a first operation and a second operation. The first operation is an operation of the test system detecting a fail address FADD of the memory device 110, and the second operation is an operation of the test system storing the detected fail address FADD in the fuse array 113 of the memory device 110.

When the memory device 110 performs a second operation, the test mediation device 130 may directly control the memory device 110 so that the memory device 110 performs an operation of storing the fall address FADD. In this case, the test mediation device 130 may directly generate the fuse address FU_ADD and input the generated fuse address FU_ADD to the memory device 110.

When the memory device 110 performs a first operation, the test mediation device 130 latches an address ADD included in the test information TEST2 now being inputted to the memory device 110 and stores the latched address ADD when the fail signal FAIL is activated. When the fail signal FAIL is activated, it means that fail occurs in memory cells CELL corresponding to an address ADD included in the test information TEST2 that is now being inputted to the memory device 110. In this case, the address ADD becomes a fail address FADD. Here, the fail address FADD may be a row address corresponding to a word line WL coupled with the fail memory cells CELL or may be a column address corresponding to a bit line BL coupled with the fail memory cells CELL.

When the second operation is performed, the test mediation device 130 may control the memory device 110. To this end, the test mediation device 130 may generate the high level voltage VH, supply the generated high level voltage VH to the memory device 110, and input the stored fail address FADD to the memory device 110. Furthermore, the test mediation device 130 may generate the fuse address FU_ADD for designating a fuse set in which the fail address FADD will be stored and input the generated fuse address FU_ADD to the memory device 110. Here, the test mediation device 130 inputs the fall address FADD or the fail address FADD and the fuse address FU_ADD to the memory device 110 by using some of or all the plurality of data pads 111 and the plurality of address pads 112.

If the plurality of data pads 111 or the plurality of data pads 111 and the plurality of address pads 112 are used, the test mediation device 130 may input the fail address FADD and the fuse address FU_ADD to the memory device 110. If the plurality of address pads 112 is used, the test mediation device 130 may input the fail address FADD to the memory device 110. The test mediation device 130 may be a built off self test (BOST) device.

The BOST device is described in brief below. As operating speed of a memory device becomes fast, a test device operating at high speed is necessary. An old model test device of a common memory device is problematic in that the test time is long because it has lower operating speed than a current memory device. A new model test device is advantageous in that it may test a memory device rapidly because the new model test device has high operating speed, but is problematic in that enormous investment costs are necessary. In order to solve the problems, the BOST device coupled between an old model test device and a memory device is used. The BOST device is coupled between a test device and a memory device and is configured to convert signals, such as a clock, a command, an address, and data received from the test device, into signals at high speed and input the converted signals to the memory device. In the case of an old model test device, the test time may be reduced using the BOST device.

More particularly, the test mediation device 130 includes a frequency conversion unit 131, a fail address storage unit 132, and a repair control unit 133. The frequency conversion unit 131 receives the test information TEST2 having a second frequency and generates the test information TEST1 having a first frequency by using the test information TEST2 having the second frequency. The fail address storage unit 132 stores a fail address FADD when the fail signal FAIL is activated. The repair control unit 133 controls an operation of the memory device 110 storing the fail address FADD in the fuse array 113.

The frequency conversion unit 131 raises the frequency of a signal having the second frequency received from the test device 120, converts the second frequency of the signal into the first frequency, and outputs the signal having the first frequency to the memory device 110. In some embodiments, the frequency conversion unit 131 may lower the frequency of a signal having a first frequency received from the memory device 110, convert the first frequency into the second frequency, and output the signal having the second frequency to the test device 120.

The fail address storage unit 132 latches an address ADD included in the test information TEST2 now being inputted to the memory device 110 and stores the latched address ADD as a fail address FADD when the fail signal FAIL is activated. Furthermore, when a second operation is performed, the fail address storage unit 132 inputs the stored fail address FADD to the memory device 110.

When the second operation is performed, the repair control unit 133 supplies the memory device 110 with high level voltage VH used to store the fall address FADD in the fuse array 133 and performs control so that the fail address FADD stored in the fail address storage unit 132 is inputted to the memory device 110. Furthermore, when the second operation is performed, the repair control unit 133 generates a fuse address FU_ADD for designating a fuse set in which the fail address FADD will be stored, from among the plurality of fuse sets FSET<1>–FSET<N> included in the fuse array 113, and input the generated fuse address FU_ADD to the memory device 110. The repair control unit 133 may include a voltage pump for generating the high level voltage VH in response to voltage, such as a power supply voltage VDD.

The entire operation of the test system is divided into a case where (1) the test system performs a first operation and a case where (2) the test system performs a second operation, and the cases (1) and (2) are described below on the basis of the aforementioned description.

(1) When the Memory System Performs the First Operation

When the first operation is performed, first, the test device 120 generates the test information TEST2 having a second frequency for the write operation of the memory device 110. Here, the test information TEST may include the command CMD, the address ADD, and the data DATA. The command CMD may be a write command that enables the memory device 110 to perform a write operation. The data DATA may have a specific pattern in order to detect a fail address FADD, and it is hereinafter assumed that the data DATA has the same value '1' or '0'.

The test mediation device 130 receives the test information TEST2 having the second frequency, converts the second frequency into a first frequency, generates the test information TEST1 having the first frequency, and outputs the test information TEST1 having the first frequency to the memory device 110.

The memory device 110 performs a write operation in response to the test information TEST1 having the first frequency. The memory device 110 writes the data DATA into memory cells CELL corresponding to the address ADD in response to the command CMD.

Next, the test device 120 generates the test information TEST2 having a second frequency for the read operation of the memory device 110. Here, the test information TEST2 may include the command CMD and the address ADD. The command CMD is a read command that enables the memory device 110 to perform a read operation. The address ADD corresponds to memory cells CELL in which data DATA having a test pattern is stored.

The test mediation device 130 receives the test information TEST2 having the second frequency, converts the second frequency into the first frequency, generates the test information TEST1 having the first frequency, and inputs the test information TEST1 having the first frequency to the memory device 110. Here, the test mediation device 130 latches the address ADD included in the test information TEST2.

The memory device 110 performs a read operation in response to the test information TEST1 having the first frequency. The memory device 110 outputs data DATA from memory cells CELL, corresponding to the address ADD, in response to the command CMD and transfers the data DATA to the plurality of data pads 111 through the plurality of global lines GIO. Here, if all the data DATA loaded onto the plurality of global lines GIO has the same value, it means that fail has not occurred in the memory cells CELL corresponding to the address ADD and thus the fall signal FAIL is deactivated. In contrast, if any one of the data DATA loaded onto the plurality of global lines GIO has a different value, it means that fail occurs in the memory cells CELL corresponding to the address ADD and thus the fail signal FAIL is activated.

The test mediation device 130 updates a latched address ADD when the fail signal FAIL is deactivated and next test information TEST2 is received and stores the latched address ADD as a fail address FADD when the fall signal FAIL is activated.

(2) When the Memory System Performs the Second Operation

When the second operation is performed, the test device 120 generates test information TEST2 for storing a fail address FADD in the memory device 110. The test information TEST2 may include all of information for the second operation, but may include only a simple command that enables the test mediation device 130 to control the second operation of the memory device 110. In the former case, the test information TEST2 may include an instruction that enables the memory device 110 to store the fail address FADD and a fuse address FU_ADD. In the latter case, the test information TEST2 does not include pieces of information, such as the instruction and the fuse address FU_ADD, but instead the test mediation device 130 may generate the pieces of information. The instruction that enables the memory device 110 to store the fail address FADD may include the command CMD that enables the memory device 110 to perform an operation of changing a state of a fuse set, for example, a fuse of the fuse sets is cut. The latter case is described below.

The test mediation device 130 generates a fuse address FU_ADD and inputs the fuse address FU_ADD to the memory device 110. Furthermore, the test mediation device 130 inputs a stored fail address FADD and high level voltage VH to the memory device 110.

The memory device 130 stores the fail address FADD in response to the fail address FADD having a first frequency, the fuse address FU_ADD, and the high level voltage VH. More particularly, the memory device 130 stores the fail address FADD in a fuse set corresponding to the fuse address FU_ADD among the first to the $N^{th}$ fuse sets FSET<1>–FSET<N> included in the fuse array 113. Here, the high level voltage VH is used to change a state of a fuse included in the fuse set.

In order to store the fail address FADD, the fuse address FU_ADD does not need to be necessarily received. If the fuse address FU_ADD is not received, the fail address FADD can be sequentially stored from the first fuse set FSET<1> to the $N^{th}$ fuse set FSET<N> or from the $N^{th}$ fuse set FSET<N> to the first fuse set FSET<1>.

The test device 120 of the test system in accordance with the exemplary embodiment of the present invention may be a test device for testing the memory device 110 in a package state or a module state. If a fail address FADD detected when testing the memory device 110 in a wafer state is sequentially from the first fuse set FSET<1> to the $N^{th}$ fuse set FSET<N>, a fail address FADD detected when testing the memory device 110 by using the test system in accordance with the exemplary embodiment of the present invention may be sequentially stored from the $N^{th}$ fuse set FSET<N> to the first fuse set FSET<1>.

In contrast, if a fail address FADD detected when testing the memory device 110 in a wafer state is sequentially stored from the $N^{th}$ fuse set FSET<N> to the first fuse set FSET<1>, a fail address FADD detected when testing the memory device 110 by using the test system in accordance with the exemplary embodiment of the present invention may be sequentially stored from the first fuse set FSET<1> to the $N^{th}$ fuse set FSET<N>. That is, order of a fuse set in which a fail address FADD is stored when testing the memory device 110 in a wafer state is made opposite to order of a fuse set in which a fail address FADD is stored when testing the memory device 110 in a package state or a module state may be reversed so that the fail address FADD is not redundantly stored in the fuse set and the fuse set may be effectively used.

If the test mediation device 130 performs the second operation by using the plurality of data pads 111 and the plurality of address pads 112, a fail address FADD may be stored in a fuse set designated by a fuse address FU_ADD by inputting the fail address FADD to the memory device 110 through the plurality of address pads 112 and inputting the fuse address FU_ADD to the memory device 110 through the plurality of data pads 111. Furthermore, if the test mediation device 130 performs the second operation by using the plurality of address pads 112, a fail address FADD may be inputted to the memory device 110 through the plurality of address pads 112. However, since the fuse address FU_ADD is unable to be inputted to the memory device 110, the fail address FADD may be sequentially stored from the first fuse set FSET<1> to the $N^{th}$ fuse set FSET<N> or may be sequentially stored from the $N^{th}$ fuse set FSET<N> to the first fuse set FSET<1>.

For reference, in the above description, an example in which some of the plurality of memory cells CELL included in the memory device 110 is selected, data DATA is stored in the selected memory cells, and whether or not fail occurs in the memory cells CELL in which the data DATA is stored is checked while immediately outputting the stored data DATA from the selected memory cells has been described, but this is for convenience of description. In one embodiment, the same data DATA may be written into all the plurality of memory cells CELL and fail memory cells CELL may be detected while sequentially outputting the data DATA from the plurality of memory cells CELL. In another embodiment, data DATA may be written into memory cells CELL within a specific range, from among the plurality of memory cells CELL, and fail memory cells may be detected while reading the data DATA from some of the memory cells CELL into which the data DATA has been written.

Figure 2:
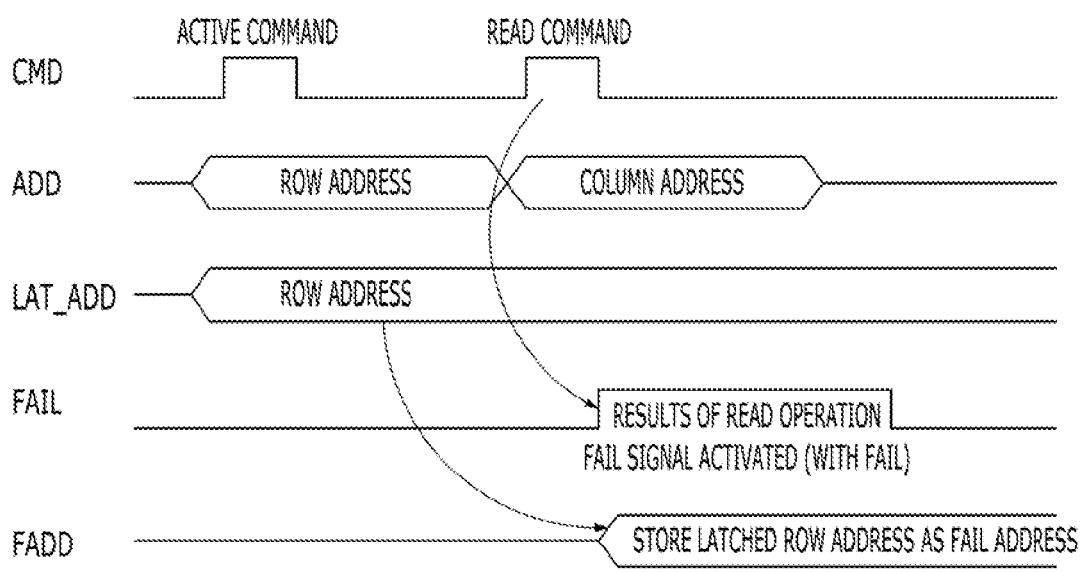
FIG. 2 is a waveform diagram illustrating a process in which the system for testing a memory device stores a fail address FADD in accordance with the exemplary embodiment of the present invention.

FIG. 2 is a waveform diagram illustrating a process of the test system storing a fall address FADD (that is, the first operation) in accordance with the exemplary embodiment of the present invention.

In FIG. 2, 'CMD' indicates the command that is inputted from the test device 120 to the memory device 110 through the test mediation device 130. 'ADD' indicates an address that is inputted from the test device 120 to the test mediation device 130 through the memory device 110. 'FAIL' indicates the fall signal that is generated from the memory device 110 and then inputted to the test mediation device 130. 'LAT_ADD' indicates an address latched in the test mediation device 130 when a test operation is performed. It is hereinafter assumed that data DATA for a test has been stored all the plurality of memory cells CELL of the memory device 110, and a subsequent operation is described. All the signals are inputted or outputted in synchronism with the clock CLK, but the dock CLK is not shown in FIG. 2.

The row address ADD for selecting a word line WL to be activated, together with the active command CMD for activating a word line WL of the memory device 110, is inputted. Next, the column address ADD for selecting a bit line BL coupled with memory cells CELL from which data DATA will be outputted, together with the read command CMD for reading data DATA from memory cells CEL coupled with the activated word line WL, is inputted. At this time, the test mediation device 130 latches the row address ADD LAT_ADD inputted together with the active command CMD.

The memory device 110 checks whether all the data DATA outputted from the selected memory cells CELL has the same value or not, that is, whether fall occurs or not in the memory cells CELL from which the data DATA has been outputted. If, as a result of the check, all the data DATA have the same value, the memory device 110 deactivates the fail signal FAIL (not shown in FIG. 2). If, as a result of the check, any one of the data DATA has a different value, the memory device 110 activates the fail signal FAIL.

When the fall signal FAIL is activated, the test mediation device 130 determines the latched address LAT_ADD as a fail address FADD and stores the fall address FADD in the fall address storage unit 132. In the above description with reference to FIG. 1, an example in which the fail address storage unit 132 latches the address ADD and stores the fail address FADD has been described. In some embodiments, a construction for latching the address ADD and a construction for storing the fail address FADD may be separated from each other.

Figure 3:
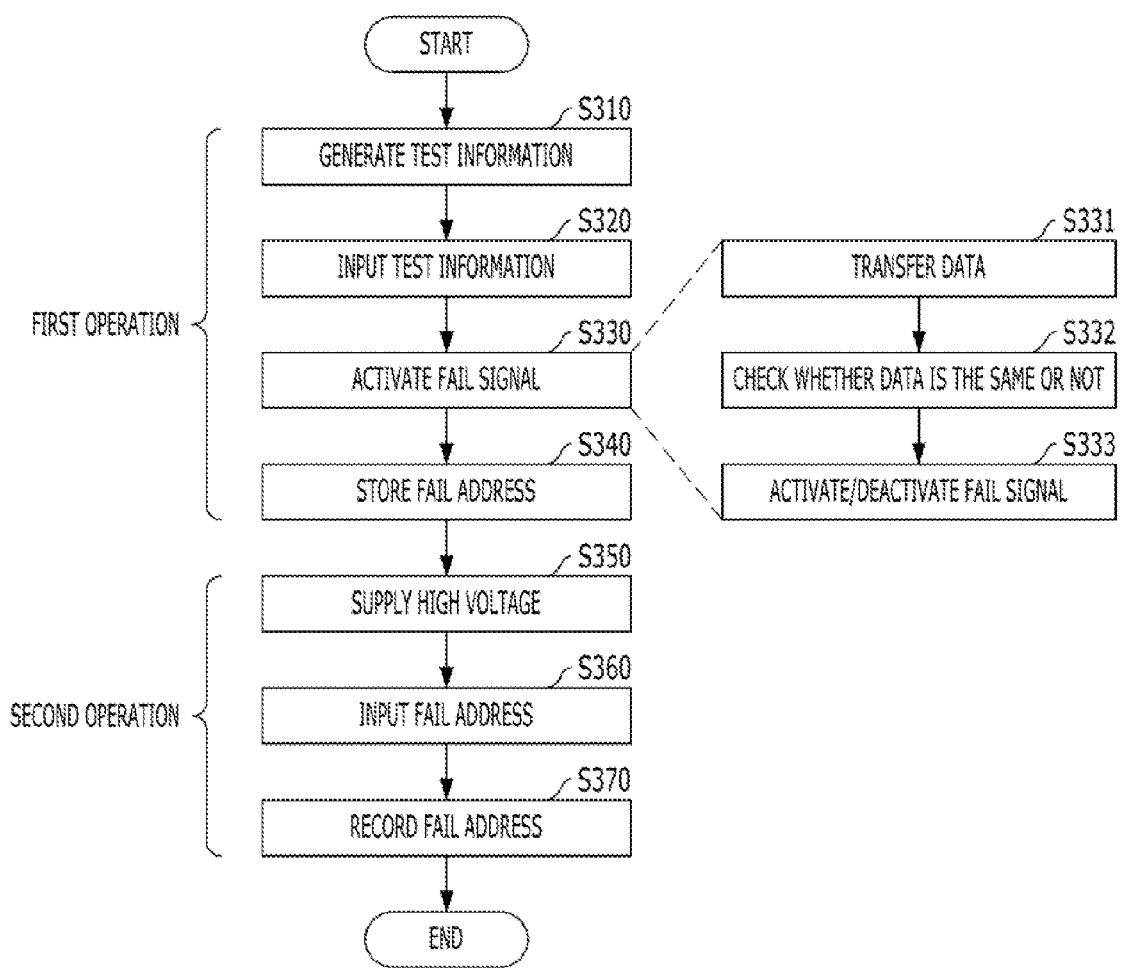
FIG. 3 is a flowchart illustrating a method of testing a memory device in accordance with the exemplary embodiment of the present invention.

FIG. 3 is a flowchart illustrating a method of testing a memory device in accordance with an exemplary embodiment of the present invention.

The test system for performing the method of testing a memory device of FIG. 3 includes the memory device 110 configured to operate at a first frequency and to include the plurality of memory cells CELL, the test device 120 configured to operate at a second frequency lower than the first frequency, and the test mediation device 130 configured to couple the memory device 110 and the test device 120 together.

As shown in FIG. 3, the method of testing a memory device includes a step S310 in which the test device 120 generates the test information TEST2 having a second frequency and inputs the test information TEST2 having the second frequency to the test mediation device 130, a step S320 in which the test mediation device 130 receives the test information TEST2 having the second frequency, generates the test information TEST having a first frequency based on the test information TEST2 having the second frequency, and inputs the test information TEST1 having the first frequency to the memory device 110, a step S330 in which the memory device 110 receives the test information TEST1 having the first frequency and activates the fail signal FAIL when memory cells CELL corresponding to an address ADD included in the test information TEST2, from among the plurality of memory cells CELL, fail, and a step S340 in which the test mediation device 130 stores a fail address FADD corresponding to the fail memory cells CELL in response to the fail signal FAIL.

The method of testing a memory device further includes a step S350 in which the test mediation device 130 generates high level voltage VPP higher than the power supply voltage VDD of the memory device 110 and supplies the high level voltage VPP to the memory device 110, a step S360 in which the test mediation device 130 inputs the fail address FADD, stored in the test mediation device 130, to the memory device 110 by using some of or all the plurality of data pads 111 and the plurality of address pads 112, and a step S370 in which the test mediation device 130 stores the fail address FADD in the fuse array 113 of the memory device 110 in response to the high level voltage VPP.

The method of testing a memory device is described below in detail with reference to FIGS. 1 to 3.

The steps S310 to S340 corresponds to the first operation of detecting a fail address FADD in the memory device 110 and storing the detected fail address FADD in the test mediation device 130.

At the step S310, the test device 120 generates the test information TEST2 having the second frequency for testing the memory device 110 and inputs the generated test information TEST2 having the second frequency to the test mediation device 130.

At the step S320, the test mediation device 130 generates the test information TEST1 having the first frequency based on the test information TEST2 having the second frequency, and inputs the test information TEST1 having the first frequency to the memory device 110.

At the step S330, the memory device 110 detects fall occurred in memory cells CELL based on a result of the operation executed in response to the test information TEST1 having the first frequency and activates or deactivates the fail signal FAIL based on a result of the detection. The memory device 110 performs an operation of writing or reading data DATA for testing the memory device 110 in response to the test information TEST1.

More particularly, the step S330 includes a step S331 in which the memory device 110 transfers the data DATA of memory cells CELL corresponding to an address ADD, from among the plurality of memory cells CELL, to the plurality of global lines GIO, a step S332 in which the memory device 110 checks whether all the data DATA of the plurality of global lines GIO has the same value or not, and a step S333 in which the memory device 110 deactivates the fail signal FAIL if, as a result of the check, all the data DATA of the plurality of global lines GIO has the same value and activates the fail signal FAIL if, as a result of the check, any one of the data DATA of the plurality of global lines GIO has a different value.

At the step S340, when the fail signal FAIL is deactivated, the test mediation device 130 does not store the address ADD. When the fall signal FAIL is activated, the test mediation device 130 stores the address ADD in the fail address storage unit 132 as a fall address FADD.

The steps S350 to S370 corresponds to the second operation of recording the fail address FADD, stored in the test mediation device 130, in a fuse set of the memory device 110.

At the step S350, the test mediation device 130 generates the high level voltage VPP and supplies the generated high level voltage VPP to the memory device 110. The high level voltage VPP is used to record the fail address FADD on a fuse set.

At the step S360, the test mediation device 130 inputs the fail address FADD or the fail address FADD and the fuse address FU_ADD, stored therein, to the memory device 110 by using some of or all the plurality of data pads 111 and the plurality of address pads 112.

At the step S370, the memory device 110 stores the received fail address FADD in a fuse set of the fuse array 113 in response to the high level voltage VPP. Here, the fall address FADD may be stored in a fuse set corresponding to the fuse address FU_ADD, may be sequentially stored from the first fuse set FSET<1> to the $N^{th}$ fuse set FSET<N>, or may be sequentially stored from the $N^{th}$ fuse set FSET<N> to the first fuse set FSET<1>.

The method of testing a memory device in accordance with the exemplary embodiment of the present invention has the same effect as the test system in accordance with the present invention.

For reference, the high level voltage VH for changing a state of a fuse may be generated from the test device 120 and supplied to the memory device 110 directly or via the test mediation device 130. In some embodiments, the high level voltage VH may be generated from the test mediation device 130 and supplied to the memory device 110. In some embodiments, the high level voltage VH may be generated outside the memory device 110 not the test device 120 and the test mediation device 130 and supplied to the memory device 110. In some embodiments, the high level voltage VH may be generated in the memory device 110.

In accordance with this technology, the test mediation device disposed between the test device 120 and the memory device 110 receives the fail signal indicating that fail occurs in the memory device and stores information for repair. Accordingly, a repair operation may be performed by using test equipment that is unable to store information for repair.

Furthermore, if information for repair is stored in the memory device, the test mediation device supplies high level voltage for cutting a fuse so that the fuse may be stably cut.

Furthermore, this technology may increase the yield of memory devices and reduce the test time and costs according to the aforementioned effects.

While the present invention has been described with respect to the specific embodiments, it will be apparent to those skilled in the art that various changes and modifications may be made without departing from the spirit and scope of the invention as defined in the following claims.

What is claimed is:

1. A system for testing a memory device, comprising:
a memory device configured to comprise a plurality of memory cells, receive a test information having a first frequency, access memory cells corresponding to an address included in the test information, and activate a fail signal if fail occurs in the memory cells corresponding to the address;
a test device configured to generate a test information having a second frequency; and
a test mediation device configured to generate the test information having the first frequency based on the test information having the second frequency, and store the address corresponding to the fail memory cells as a fail address when the fail signal is activated,
wherein the memory device further comprises:
a fuse array configured to comprise a plurality of fuse sets for storing the fail address,
wherein the test mediation device is configured to supply a high level voltage higher than a power supply voltage of the memory device to the memory device and input the fail address to the memory device when the fail address is stored in the fuse array of the memory device.

2. The system of claim 1, wherein the test information includes at least one of a clock, a command, and data.

3. The system of claim 2, wherein the memory device comprises:

a plurality of data pads configured to input and output data;
a plurality of address pads configured to receive the address; and
a plurality of global lines configured to transfer the data between the plurality of data pads and the plurality of memory cells.

4. The system of claim 3, wherein the test device is configured to generate a fuse address for designating a fuse set configured to store the fail address, from among the plurality of fuse sets included in the fuse array.

5. The system of claim 3, wherein the test mediation device is configured to generate a fuse address for designating a fuse set configured to store the fail address, among the plurality of fuse sets included in the fuse array.

6. The system of claim 3, wherein the test mediation device is configured to input the fail address or the fail address and a fuse address for designating a fuse set in which the fail address will be stored, from among the plurality of fuse sets, to the memory device by using some of or all the plurality of data pads and the plurality of address pads when the fail address is stored in the fuse array of the memory device.

7. The system of claim 3, wherein when data of the memory cells corresponding to the address is read in response to the test information, the memory device is configured to transfer the data of the memory cells to the plurality of data pads through the plurality of global lines and activate the fail signal in response to the data of the plurality of global lines.

8. The system of claim 7, wherein the memory device is configured to deactivate the fail signal when all the data of the plurality of global lines has an identical value and activate the fail signal when any one of the data of the plurality of global lines has a different value.

9. The system of claim 3, wherein the test mediation device comprises:
a frequency conversion unit configured to generate the test information having the first frequency based on the test information having the second frequency;
a fail address storage unit configured to store the fail address when the fail signal is activated; and
a repair control unit configured to control an operation of storing the fail address in the fuse array of the memory device.

10. The system of claim 9, wherein when the operation of storing the fail address in the fuse array of the memory device is performed, the repair control unit is configured to supply the memory device with high level voltage used to perform the operation of storing the fail address in the fuse array and control the fail address storage unit to store the fail address so that the stored fail address is inputted to the memory device.

11. The system of claim 10, wherein when the operation of storing the fail address in the fuse array of the memory device is performed, the repair control unit is configured to generate a fuse address for designating a fuse set configured to store the fail address among the plurality of fuse sets included in the fuse array, and input the generated fuse address to the memory device.

12. The system of claim 3, wherein:
the fuse array includes first to $N^{th}$ fuse sets, and
the memory device is configured to sequentially store the fail address, detected as a result of a probe test, from the first fuse set of the first to the $N^{th}$ fuse sets and sequentially store the fail address, detected as a result of a package test, from the $N^{th}$ fuse set of the first to the $N^{th}$ fuse sets.

13. The system of claim 1, wherein the second frequency is lower than the first frequency.

14. A test mediation device for coupling a memory device operating at a first frequency and a test device operating at a second frequency, the test mediation device comprising:
a frequency conversion unit configured to generate a test information having the first frequency based on a test information having the second frequency; and
a fail address storage unit configured to store an address included in the test information as a fail address in response to a fail signal indicating that fail occurs in the memory device,
wherein the test mediation device further comprises:
a repair control unit configured to control an operation of storing the fail address in a fuse array of the memory device,
wherein when the operation of storing the fail address in the fuse array of the memory device is performed, the repair control unit is configured to supply the memory device with a high level voltage used to perform the operation of storing the fail address in the fuse array and to control the fail address storage unit to store the fail address so that the stored fail address is inputted to the memory device.

15. The test mediation device of claim 14, wherein the test information includes at least one of a clock, a command, and data.

16. The test mediation device of claim 14, wherein
the memory device comprises a plurality of data pads configured to input and output data and a plurality of address pads configured to receive an address, and
the fail address is stored in the memory device by using the plurality of data pads and the plurality of address pads.

17. The test mediation device of claim 14, wherein the memory device comprises a plurality of memory cells and activates the fail signal if fail occurs in the memory cells corresponding to the address.

18. A method of testing a memory device by using a memory device testing system, wherein the memory device testing system includes the memory device configured to operate at a first frequency, a test device configured to operate at a second frequency, and a test mediation device configured to couple the memory device and the test device together, the method comprising:
by the test device, generating a test information having the second frequency;
by the test mediation device, generating a test information having the first frequency based on the test information having the second frequency;
by the memory device, receiving the test information having the first frequency and activating a fail signal if fail occurs in memory cells corresponding to an address included in the test information;
by the test mediation device, storing the address corresponding to the fail memory cell as a fail address in response to the fail signal, wherein the memory device further comprises a fuse array configured to comprise a plurality of fuse sets for storing the fail address,
by the test mediation device, generating a high level voltage higher than a power supply voltage of the memory device and supplying the high level voltage to the memory device; and
by the memory device, receiving the fail address stored in the test mediation device by using the plurality of data pads and the plurality of address pads.

19. The method of claim 18, wherein the test information includes at least one of a clock, a command, and data.

20. The method of claim 19, wherein the memory device comprises:

a plurality of data pads configured to input and output data;
a plurality of address pads configured to receive an address; and
a plurality of global lines configured to transfer the data between the plurality of data pads and the plurality of memory cells.

22. The method of claim 20, further comprising
storing the fail address in the fuse array of the memory device by using the high level voltage.

22. The method of claim 20, wherein the activating of the fail signal comprises:
transferring data of the memory cells corresponding to the address, to the plurality of global lines;
checking whether all the data of the plurality of global lines has an identical value or not; and
deactivating the fail signal if all the data of the plurality of global lines has the identical value and activating the fail signal if any one of the data of the plurality of global lines has a different value.

* * * * *